(12) United States Patent
Miyoshi et al.

(10) Patent No.: US 6,335,550 B1
(45) Date of Patent: Jan. 1, 2002

(54) FET WITH FERROELECTRIC GATE

(75) Inventors: Tetsu Miyoshi, Kashiwa; Kazuya Ishihara, Souraku-gun; Takeshi Kijima, Urawa, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/513,084

(22) Filed: Feb. 25, 2000

(30) Foreign Application Priority Data

Feb. 26, 1999 (JP) .......................................... 11-049397

(51) Int. Cl.$^7$ .............................................. H01L 29/76
(52) U.S. Cl. ........................ 257/295; 257/288; 438/197; 438/3
(58) Field of Search ................................ 257/288, 295; 438/197, 3

(56) References Cited

U.S. PATENT DOCUMENTS

| 5,523,964 A | * | 6/1996 | McMillan et al. | ........... 365/145 |
| 6,100,558 A | * | 8/2000 | Krivokapic et al. | ........ 257/310 |

FOREIGN PATENT DOCUMENTS

| JP | A-8-055918 | 2/1996 |
| JP | A-11 040683 | 12/1999 |

OTHER PUBLICATIONS

Office Action from German PTO dated May 29, 2001.
Patent Abstracts of Japan No. 08055918, published Feb. 27, 1996.
Sep. issue, 1997 of Nikkei Microdevices, pp. 46–57 (in Japanese).

* cited by examiner

*Primary Examiner*—Nathan Flynn
*Assistant Examiner*—Scott R. Wilson
(74) *Attorney, Agent, or Firm*—Nixon & Vanderhye P.C.

(57) ABSTRACT

A dummy gate electrode is formed just above a channel formation region of a semiconductor substrate by patterning a dummy gate electrode material which is formed on the semiconductor substrate. A dopant is ion-implanted into a surface portion of the semiconductor substrate with the dummy gate electrode used as a mask. Thereby, a source/drain region is formed in self alignment to the dummy gate electrode. A first interlayer insulator is overall formed on the substrate and the dummy gate electrode, and thereafter the first interlayer insulator is subjected to a planarization process to expose a top surface of the dummy gate electrode. A trench is formed on the semiconductor substrate by removing the dummy gate electrode. A gate is made in the trench by forming a buffer dielectric film, a ferroelectric film and a gate electrode material sequentially in this order. Thus, the gate is formed without introduction of any damage in peripheral portions of the trench and without decrease of vertical components of spontaneous polarization in the ferroelectric film.

6 Claims, 7 Drawing Sheets

FET WITH FERROELECTRIC GATE

BACKGROUND OF THE INVENTION

The present invention relates to semiconductor memory devices and methods for fabricating the semiconductor memory devices and, more particularly, to semiconductor memory devices having a ferroelectric capacitive element and fabrication methods therefor.

Hitherto, semiconductor memory devices, in particular, nonvolatile memory devices using ferroelectrics have been proposed. As one of information retaining methods therefor, there has been available a method in which electric charges are retained at the gate electrode of a field-effect transistor.

With reference to FIGS. 7A to 7F, below described is a semiconductor memory device of the prior art using the method in which electric charges are retained to the gate electrode of a field-effect transistor as described in Japanese Patent Laid-Open Publication HEI 8-55918. FIGS. 7A to 7F are fabrication process diagrams of a semiconductor memory device of the prior art using the method in which electric charges are retained at the gate electrode of a field-effect transistor.

Figure 7A:
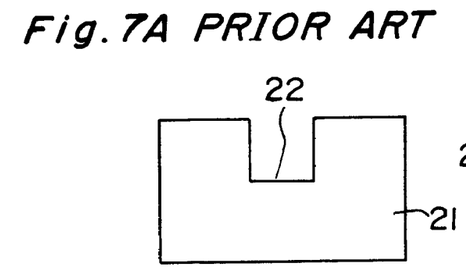
FIGS. 7A, 7B, 7C, 7D, 7E and 7F are fabrication process diagrams of a nonvolatile semiconductor memory device using ferroelectric film as the gate insulator according to the prior art.
Figure 7B:
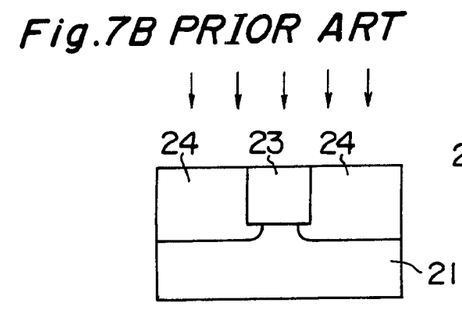

First, as shown in FIG. 7A, a trench 22 is formed in a p-type semiconductor substrate 21 by lithography and etching. Then, as shown in FIG. 7B, silicon oxide 23 is buried into the trench 22. Then, into the semiconductor substrate 21 is ion-implanted an n-type dopant that makes the semiconductor substrate 21 into a conductive type opposite to that of the semiconductor substrate, and subsequently high-temperature heat treatment is performed to thereby electrically activate the dopant, by which a source/drain region 24 is formed.

Figure 7C:
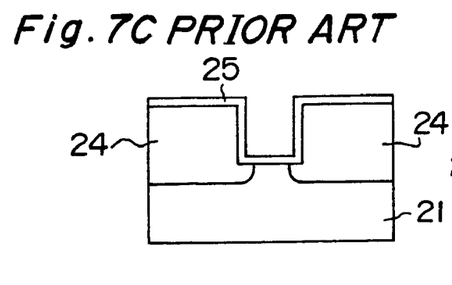
Figure 7D:
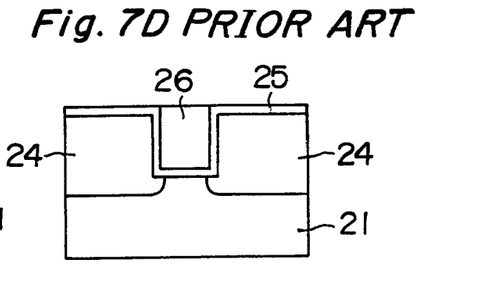

Next, as shown in FIG. 7C, by selectively removing the silicon oxide 23 buried into the trench 22, a trench is formed and thereafter silicon oxide 25, which is a low dielectric constant insulator, is deposited overall. Next, as shown in FIG. 7D, $Bi_4Ti_3O_{12}$ is sputtered and deposited in the trench as a ferroelectric film 26, and buried by etchback.

Figure 7E:
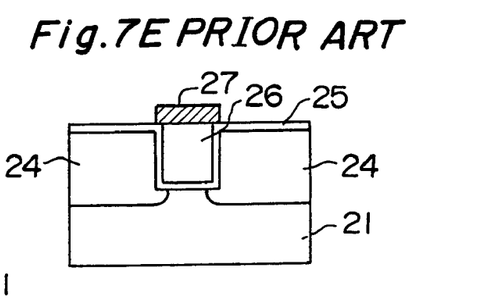
Figure 7F:
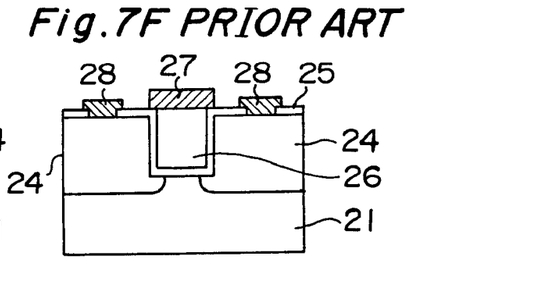

Next, as shown in FIG. 7E, Pt is deposited on the ferroelectric film 26 as a gate electrode 27. As the method for burying the ferroelectric film 26 in the trench 22, it is also possible to perform mechanical polishing, chemical polishing or mechanical-chemical polishing after the deposition of the ferroelectric film. Finally, as shown in FIG. 7F, interconnections of metallic source/drain electrodes 28 are implemented, thus completing the process.

By using the above method, because the source/drain region is formed before the formation of the ferroelectric film, constituent elements of the ferroelectric film can be prevented from being diffused in the semiconductor substrate due to the heat treatment for the formation of the source/drain region. Also, since the ferroelectric film can be formed in self alignment to the source/drain region, it becomes possible to realize a highly integrated nonvolatile memory device in which device dimensions have been scaled down.

However, with the use of the above-described process, there is a disadvantage that since peripheral portions of the trench are damaged during the formation of the trench in the semiconductor substrate by etching, transistor characteristics would be deteriorated. Further, since the interface between the gate ferroelectric film and the semiconductor substrate is located lower than the surface of the source/drain region, a horizontal electric field is applied to the gate ferroelectric film by the bias between the source and drain regions, so that vertical components of spontaneous polarization would lower, as a further disadvantage.

SUMMARY OF THE INVENTION

An object of the present invention is to provide a semiconductor memory device and a fabrication method therefor without the above technical disadvantages, which makes it possible to form the source/drain region before the gate formation and to form the gate ferroelectric film in self alignment to the source/drain region.

In order to achieve the above object, according to the present invention, there is provided a semiconductor memory device comprising: a semiconductor substrate of a first conductive type; a source/drain region of a second conductive type opposite to the first conductive type formed in the semiconductor substrate; an interlayer insulator formed on the semiconductor substrate; a trench formed in the interlayer insulator in self alignment to the source/drain region, the trench extending so as to reach a surface of the semiconductor substrate; and a gate formed at least on an inner wall of the trench.

In an embodiment of the semiconductor memory device, the gate has a lamination structure of the gate ferroelectric film and the gate electrode in this order from the semiconductor substrate side.

In an embodiment of the semiconductor memory device, a gate buffer dielectric film is provided between the gate ferroelectric film and the semiconductor substrate.

The present invention also provides a method for fabricating a semiconductor memory device, comprising: a step of forming a dummy gate electrode material on an overall surface of a semiconductor substrate of a first conductive type; a step of forming a dummy gate electrode just above a channel formation region of the semiconductor substrate by patterning the dummy gate electrode material; a step of forming a source/drain region of a second conductive type opposite to the first conductive type in self alignment to the dummy gate electrode by ion-implanting a dopant of the second conductive type with the dummy gate electrode used as a dopant implantation mask and thereafter performing heat treatment to thereby activate the dopant; a step of forming an interlayer insulator overall to coat the dummy gate electrode therewith; a step of exposing a top surface of the dummy gate electrode by subjecting the interlayer insulator to a planarization process; a step of forming in the interlayer insulator a trench that reaches a semiconductor substrate surface in self alignment to the source/drain region by selectively removing only the dummy gate electrode; a step of burying a gate electrode material and a ferroelectric film into the trench by forming overall the ferroelectric film and the gate electrode material sequentially in this order; and a step of forming a gate comprising a gate electrode and a gate ferroelectric film in self alignment to the source/drain region by patterning the gate electrode material and the ferroelectric film.

According to the above invention, since the ferroelectric film is formed in self alignment to the source/drain region, when a multiplicity of devices are formed on a semiconductor substrate, the characteristics of the devices shows less variations. Also, because heat is not applied to the ferroelectric film, structural deformations such as cracks are not observed in the ferroelectric film even after the completion of the process. Furthermore, according to a dopant analysis, neither diffusion of ferroelectric material elements into the substrate nor increase in the leak current is not observed.

Consequently, by forming the source/drain region before the gate formation, and by forming the gate ferroelectric film in self alignment to the source/drain region, activation of the dopant in the source/drain region and the assurance of film quality of the ferroelectric film can be achieved at the same time, so that the transistor characteristics can be prevented from deterioration. Further, a highly integrated nonvolatile semiconductor memory device having scaled-down device dimensions and using ferroelectric film can be obtained.

In an embodiment of the method for fabricating a semiconductor memory device, the method for fabricating a semiconductor memory device further comprises: a step of burying a gate electrode material, a ferroelectric film and a buffer dielectric film into the trench by forming overall the buffer dielectric film, the ferroelectric film and the gate electrode material sequentially in this order after the formation of the trench; and a step of forming a gate comprising a gate electrode, a gate ferroelectric film and a gate buffer dielectric film in self alignment to the source/drain region by patterning the gate electrode material, the ferroelectric film and buffer dielectric film.

The present invention further provides a method for fabricating a semiconductor memory device, comprising: a step of forming a buffer dielectric film and a dummy gate electrode material sequentially in this order on an overall surface of a semiconductor substrate of a first conductive type; a step of forming a dummy gate electrode and a gate buffer dielectric film just above a channel formation region of the semiconductor substrate by patterning the dummy gate electrode material and the buffer dielectric film; a step of forming a source/drain region of a second conductive type opposite to the first conductive type in self alignment to the dummy gate electrode by ion-implanting a dopant of the second conductive type with the dummy gate electrode used as a dopant implantation mask and thereafter performing heat treatment to thereby activate the dopant; a step of forming an interlayer insulator overall to coat the dummy gate electrode; a step of exposing a top surface of the dummy gate electrode by subjecting the interlayer insulator to a planarization process; a step of forming in the interlayer insulator a trench that reaches a gate buffer dielectric film surface in self alignment to the source/drain region by selectively removing only the dummy gate electrode; a step of burying a gate electrode material and a ferroelectric film into the trench by forming overall the ferroelectric film and the gate electrode material sequentially in this order; and a step of forming a gate comprising a gate electrode, a gate ferroelectric film and the gate buffer dielectric film in self alignment to the source/drain region by patterning the gate electrode material and the ferroelectric film.

With adoption of this invention, the ferroelectric film can be formed with better alignment to the source/drain region.

In an embodiment of the method for fabricating a semiconductor memory device, the semiconductor substrate is a silicon substrate and the buffer dielectric film is formed of $Bi_2SiO_5$.

According to the above embodiment, when $Bi_2Ti_3O_{12}$ is used for the ferroelectric film, a C-axis oriented $Bi_2Ti_3O_{12}$ suitable for low voltage drive can be formed.

In an embodiment of the method for fabricating a semiconductor memory device, a surface of the interlayer insulator and the top surface of the dummy gate electrode are made into the same surface by performing the planarization process for the interlayer insulator by using chemical-mechanical polishing process.

According to the above embodiment, planarization of the semiconductor device can be achieved.

In an embodiment of the method for fabricating a semiconductor memory device, the surface of the interlayer insulator, the top surface of the dummy gate electrode and a surface of device-isolating field oxide are made into the same surface by performing the planarization process for the interlayer insulator by using chemical-mechanical polishing process.

According to the above embodiment, further planarization of the semiconductor device can be achieved.

The present invention still further provides a method for fabricating a semiconductor memory device, comprising: a step of forming, in a semiconductor substrate of a first conductive type, a dopant diffusion region of a second conductive type opposite to the first conductive type by ion-implanting a dopant of the second conductive type on an overall surface of the semiconductor substrate; a step of, after forming overall an interlayer insulator, forming in the interlayer insulator a trench that reaches a semiconductor substrate surface just above a channel formation region of the semiconductor substrate by patterning the interlayer insulator; a step of forming a source/drain region of the second conductive type in self alignment to the trench by ion-implanting a dopant of the first conductive type with the interlayer insulator used as a dopant implantation mask and thereafter performing heat treatment to thereby activate the dopant so that the dopant diffusion region of the second conductive type just under the trench is made into a dopant diffusion region of the first conductive type; a step of burying a gate electrode material and a ferroelectric film into the trench by forming overall the ferroelectric film and the gate electrode material sequentially in this order; and a step of forming a gate comprising a gate electrode and a gate ferroelectric film in self alignment to the source/drain region by patterning the gate electrode material and the ferroelectric film.

With adoption of this invention, since a ferroelectric film can be formed in self alignment to the source/drain region without the formation or removal of dummy gate electrode, the required man-hour of process can be reduced.

In an embodiment of the method for fabricating a semiconductor memory device, the heat treatment to thereby activate the dopant is performed after implanting the dopant of the second conductive type in the overall surface of the semiconductor substrate of the first conductive type.

In an embodiment of the method for fabricating a semiconductor memory device, there is provided the method for fabricating a semiconductor memory device, further comprising: a step of, subsequent to the step of making the dopant diffusion region of the second conductive type just under the trench into the dopant diffusion region of the first conductive type, burying the gate electrode material, a ferroelectric film and a buffer dielectric film into the trench by forming overall the buffer dielectric film, the ferroelectric film and the gate electrode material sequentially in this order; and a step of forming a gate comprising the gate electrode, the gate ferroelectric film and a gate buffer dielectric film in self alignment to the source/drain region by patterning the gate electrode material, the ferroelectric film and the buffer dielectric film.

In an embodiment of the method for fabricating a semiconductor memory device, the dummy gate electrode material is formed of silicon nitride and the interlayer insulator is formed of silicon oxide.

According to the above embodiment, in the process of planarization of the first interlayer insulator by CMP process, the dummy gate electrode fulfills the function as a stopper film successfully.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail with reference to embodiments thereof.

(First Embodiment)

FIGS. 1A to 1E and 2A to 2E are fabrication process diagrams of a semiconductor memory device according to a first embodiment of the invention. In FIGS. 1A to 1E and 2A to 2E are shown a p-type semiconductor substrate 1, field oxide 2, overcoating oxide 3, a dummy gate electrode material 4, a dummy gate electrode 4a, a source/drain region 5, a first interlayer insulator 6, a trench 7, a buffer dielectric film 8, a gate buffer dielectric film 8a, a ferroelectric film 9, a gate ferroelectric film 9a, a gate electrode material 10, a gate electrode 10a, a second interlayer insulator 11, and a source/drain electrode 12.

Figure 1A:
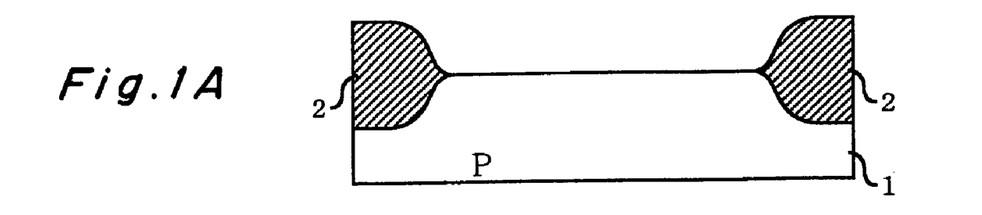
FIGS. 1A, 1B, 1C, 1D and 1E are first-half fabrication process diagrams of a semiconductor memory device according to a first embodiment of the invention.
Figure 1B:
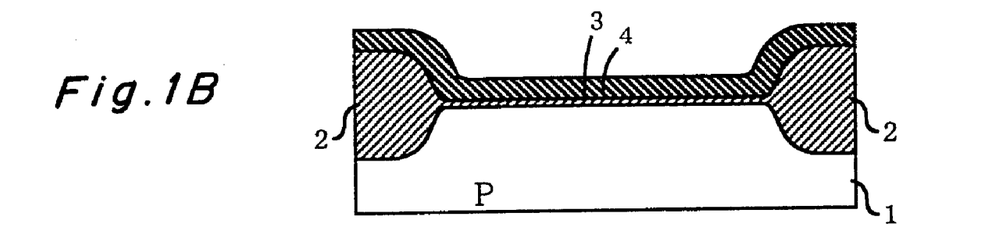

First, as shown in FIG. 1A, silicon oxide is formed by thermal oxidation as the field oxide 2 in a specified region of a p-type silicon substrate used as the p-type semiconductor substrate 1. Next, as shown in FIG. 1B, on surface portion of the p-type semiconductor substrate 1 where the field oxide 2 is not provided, silicon oxide is formed by thermal oxidation as the overcoating oxide 3. Further, on the overall surface of the p-type semiconductor substrate 1, silicon nitride is formed as the dummy gate electrode material 4 by CVD process.

Figure 1C:
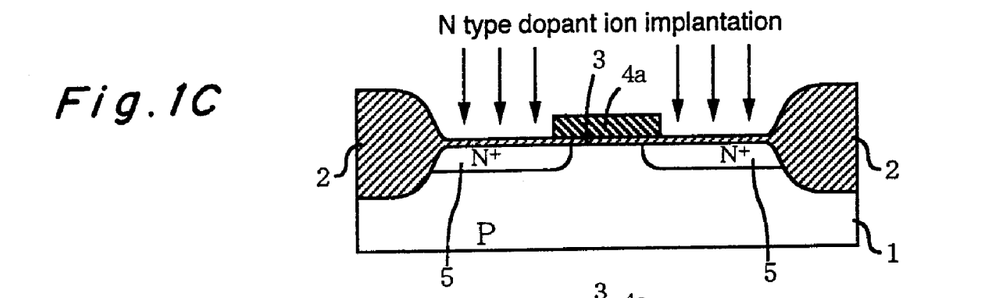
Figure 1D:
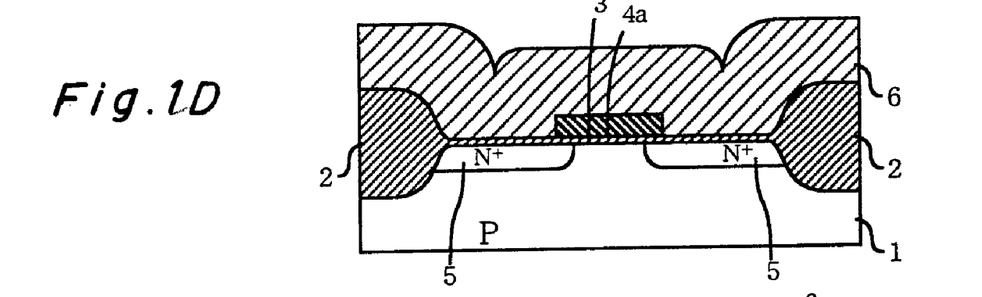

Next, as shown in FIG. 1C, the dummy gate electrode material 4 is patterned by lithography and dry etching, by which the dummy gate electrode 4a is formed just above the channel formation region of the p-type semiconductor substrate 1. Subsequently, with the dummy gate electrode 4a used as a dopant implantation mask, an n-type dopant, arsenic (As), is ion-implanted in the overall surface of the p-type semiconductor substrate 1, and further high-temperature heat treatment is performed to activate the dopant, by which an n-type source/drain region 5 is formed in self alignment to the dummy gate electrode 4a. Then, as shown in FIG. 1D, silicon oxide is formed by CVD process as the first interlayer insulator 6 on the overall surface of the p-type semiconductor substrate 1, by which the dummy gate electrode 4a is coated.

Figure 1E:
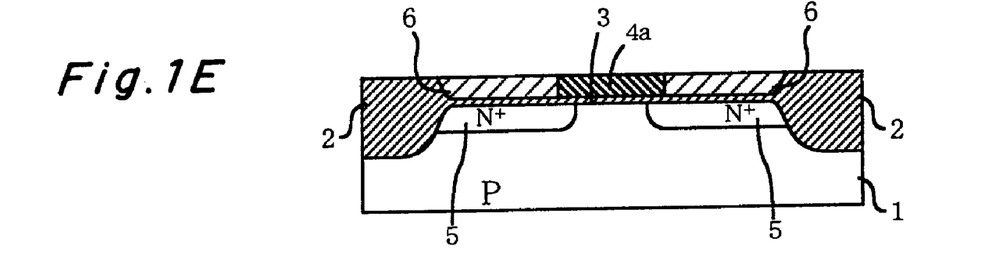

Next, as shown in FIG. 1E, with the dummy gate electrode 4a used as a stopper film, the first interlayer insulator 6 is subjected to a planarization process, by which the top surface of the dummy gate electrode 4a is exposed. In addition, CMP (Chemical Mechanical Polishing) process is used for the planarization process. In this planarization process, the field oxide 2 is also planarized simultaneously.

Figure 2A:
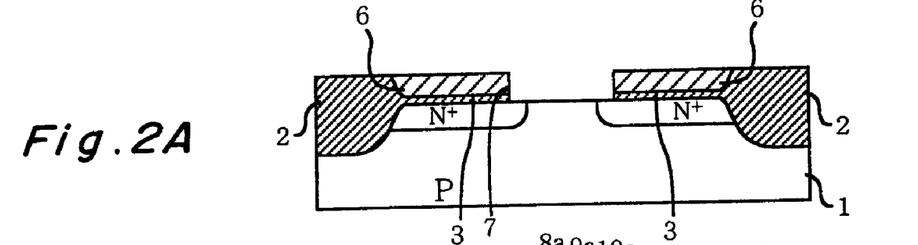
FIGS. 2A, 2B, 2C, 2D and 2E are second-half fabrication process diagrams of the semiconductor memory device according to the first embodiment of the invention.

Next, as shown in FIG. 2A, the dummy gate electrode 4a only is selectively removed with a phosphate base solution, by which the trench 7 is formed in the first interlayer insulator 6 so as to reach the surface of the p-type semiconductor substrate 1 in self alignment to the source/drain region 5. Subsequently, the overcoating oxide 3 remaining at the bottom of the trench 7 is removed by fluoric selection, by which the surface of the p-type semiconductor substrate 1 is exposed. In this process, because processing time for removing the overcoating oxide 3 is very short, the film thickness of the first interlayer insulator 6 and the configuration of the trench 7 does not change almost at all.

Figure 2B:
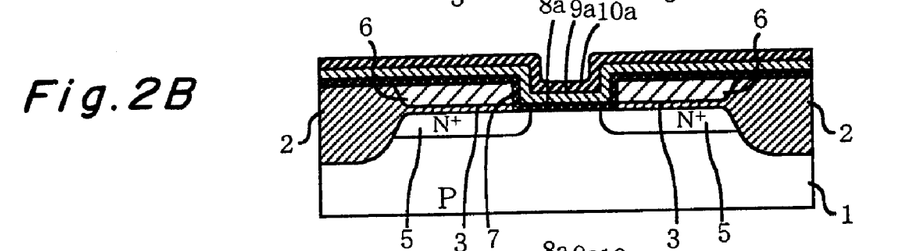

Next, as shown in FIG. 2B, $Bi_2SiO_5$ is formed by CVD process as the buffer dielectric film 8 on the overall surface of the p-type semiconductor substrate 1, subsequently $Bi_4Ti_3O_{12}$ (hereinafter, referred to as "BIT") is formed by CVD process as the ferroelectric film 9, and further Pt is formed as the gate electrode material 10 by sputtering. In this case, $Bi_2SiO_5$ constituting the buffer dielectric film 8 is characterized by being {100} oriented when formed on silicon single crystal and silicon oxide. When BIT constituting the ferroelectric film 9 is formed on such {100} oriented $Bi_2SiO_5$ is formed, epitaxial growth of C-axis oriented BIT advantageous for low voltage drive is enabled.

Figure 2C:
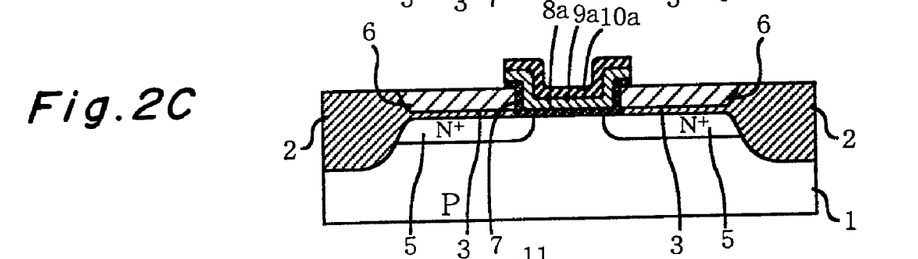

Next, as shown in FIG. 2C, continuous patterning is performed by using lithography and dry etching in order that at least the gate electrode material 10, the ferroelectric film 9 and the buffer dielectric film 8 formed within the trench 7 are left, by which a gate comprising the gate electrode 10a, the gate ferroelectric film 9a and the gate buffer dielectric film 8a is formed in self alignment to the source/drain region 5.

Figure 2D:
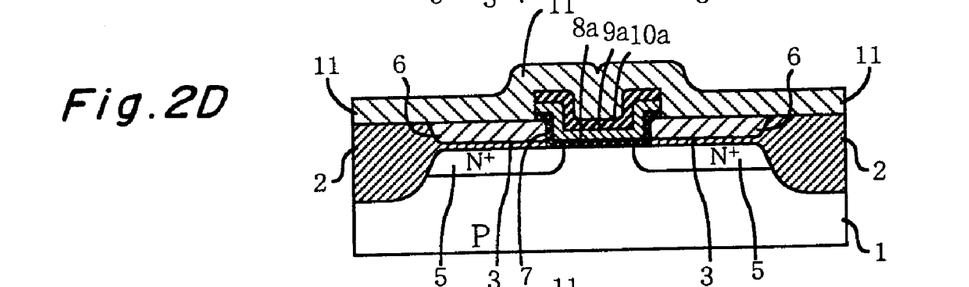

Next, as shown in FIG. 2D, silicon oxide is formed by CVD process as the second interlayer insulator 11 on the overall surface of the p-type semiconductor substrate 1, by which the gate is coated.

Figure 2E:
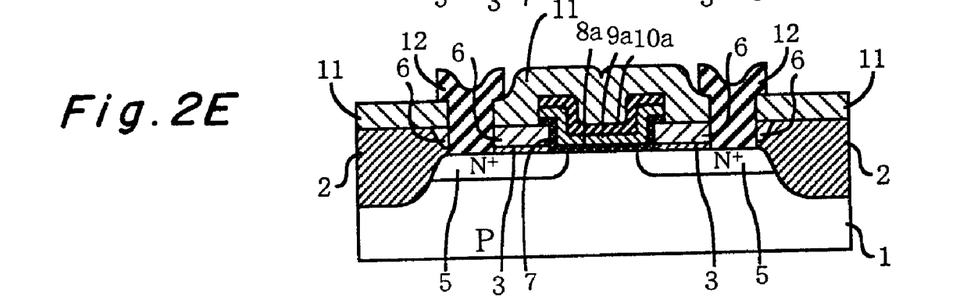

Finally, as shown in FIG. 2E, a contact hole that extends through the second interlayer insulator 11 and the first interlayer insulator 6 to reach the source/drain region 5 is formed by a known technique, and the contact hole is filled up with an electrically conductive material by sputtering process, by which the source/drain electrode 12 is formed, thus the process being completed.

Although BIT has been used as the ferroelectric film, it is also possible to use $(Pb_xLa_{1-x})(Zr_yTi_{1-y})O_3$ ($0 \leq x, y \leq 1$), $SrBi_2(Ta_xNb_{1-x})_2O_9$ ($0 \leq x \leq 1$), $BaMgF_4$ or the like. Also, although $Bi_2SiO_5$ has been used as the buffer dielectric film, $CeO_2$, $Y_2O_3$, $ZrO_2$, MgO, $SrTiO_3$, $SiO_2$ and the like may alternatively be used.

Also, although Pt has been used as the gate electrode material, the gate electrode material may also be made from Ir, Ru, Au, Ag, Al, Rh, Os or other metal materials and their oxide materials, or polysilicon. Further, the field-effect type semiconductor memory device of the first embodiment may also be one in which p-type source/drain region is formed with an n-type semiconductor substrate.

(Second Embodiment)

FIGS. 3A to 3E and 4A to 4E are fabrication process diagrams of a semiconductor memory device according to a second embodiment of the invention. Component members identical to those of FIGS. 1A to 1E and 2A to 2E are designated by like reference numerals and their description is omitted. This embodiment is a modification of the first embodiment, where the gate buffer dielectric film 8a is formed only at the bottom face of the trench 7. As a result of this, the alignment between the gate ferroelectric film 9a and the source/drain region 5 is enhanced.

Figure 3A:
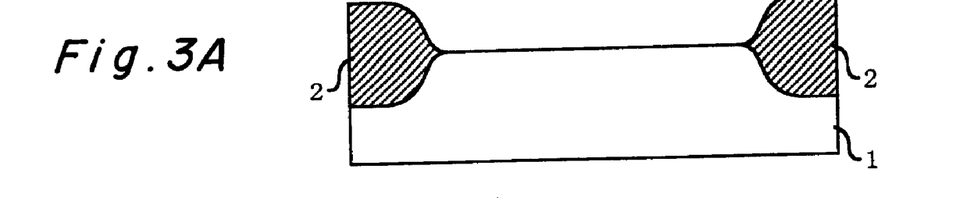
FIGS. 3A, 3B, 3C, 3D and 3E are first-half fabrication process diagrams of a semiconductor memory device according to a second embodiment of the invention.
Figure 3B:
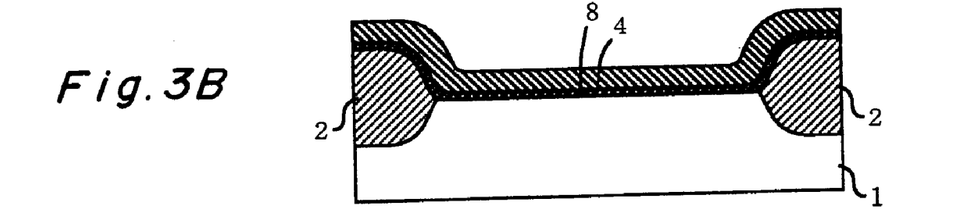

First, as shown in FIG. 3A, silicon oxide is formed by a known technique as the field oxide 2 in a specified region of a p-type silicon substrate used as the p-type semiconductor substrate 1. Next, as shown in FIG. 3B, on the overall surface of the p-type semiconductor substrate 1, $Bi_2SiO_5$ is formed by CVD process as the buffer dielectric film 8, and subsequently silicon nitride is formed as the dummy gate electrode material 4 by CVD process.

Figure 3C:
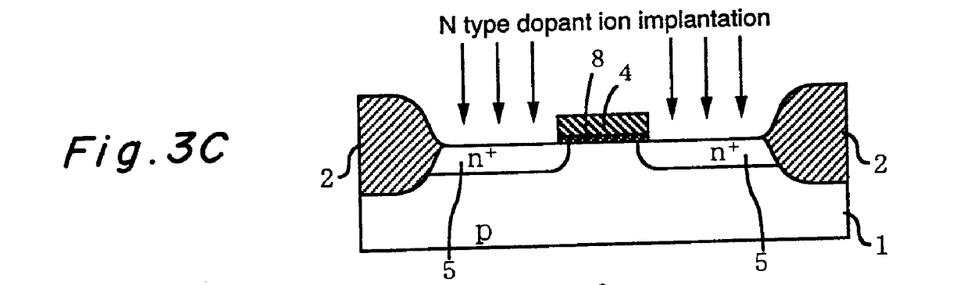

Next, as shown in FIG. 3C, the dummy gate electrode material 4 and the buffer dielectric film 8 are continuously patterned by lithography and dry etching, by which the dummy gate electrode 4a is formed via the gate buffer dielectric film 8a just above the channel formation region of the p-type semiconductor substrate 1. Subsequently, with the dummy gate electrode 4a used as a dopant implantation mask, an n-type dopant As is ion-implanted in the overall surface of the p-type semiconductor substrate 1, and further high-temperature heat treatment is performed to activate the dopant, by which an n-type source/drain region 5 is formed in self alignment to the dummy gate electrode 4a.

Figure 3D:
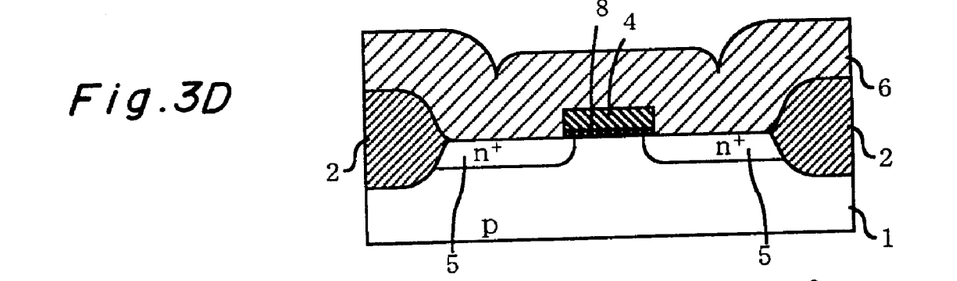

Next, as shown in FIG. 3D, silicon oxide is formed by CVD process as the first interlayer insulator 6 on the overall surface of the p-type semiconductor substrate 1, by which the dummy gate electrode 4a and the gate buffer dielectric film 8a are coated.

Figure 3E:
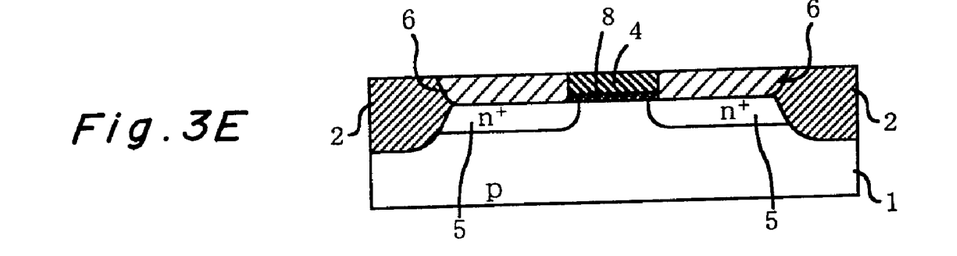

Next, as shown in FIG. 3E, with the dummy gate electrode 4a used as a stopper film, the first interlayer insulator 6 is subjected to a planarization process, by which the top surface of the dummy gate electrode 4a is exposed. In addition, CMP process is used for the planarization process. In this planarization process, the field oxide 2 is also planarized simultaneously.

Figure 4A:
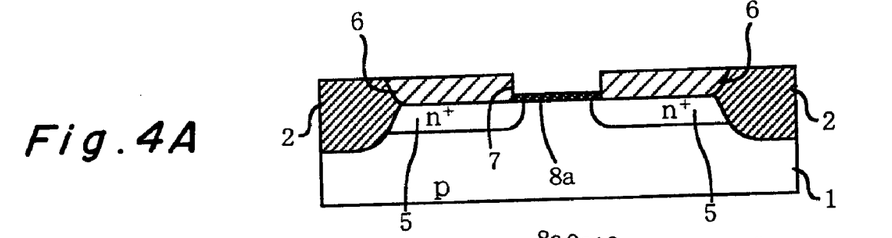
FIGS. 4A, 4B, 4C, 4D and 4E are second-half fabrication process diagrams of the semiconductor memory device according to the second embodiment of the invention.

Next, as shown in FIG. 4A, the dummy gate electrode 4a is selectively removed with a phosphate base solution, by which the trench 7 is formed in the first interlayer insulator 6 so as to reach the surface of the gate buffer dielectric film 8a in self alignment to the source/drain region 5.

Figure 4B:
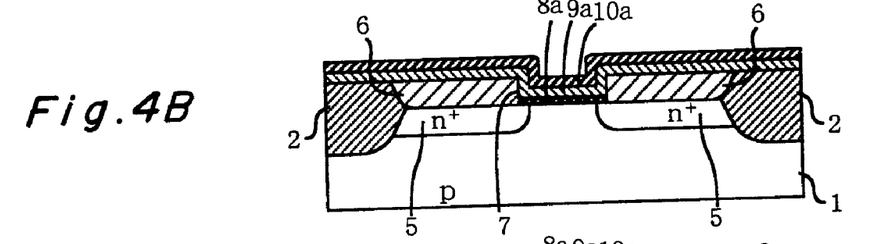
Figure 4C:
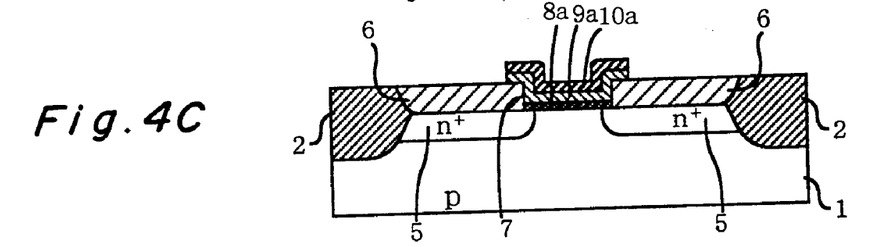

Next, as shown in FIG. 4B, BIT is formed by CVD process as the ferroelectric film 9 on the overall surface of the p-type semiconductor substrate 1, and further Pt is formed as the gate electrode material 10 by sputtering. Next, as shown in FIG. 4C, continuous patterning is performed by using lithography and dry etching in order that at least the gate electrode material 10 and the ferroelectric film 9 formed within the trench 7 are left, by which a gate comprising the gate electrode 10a, the gate ferroelectric film 9a and the gate buffer dielectric film 8a is formed in self alignment to the source/drain region 5.

Figure 4D:
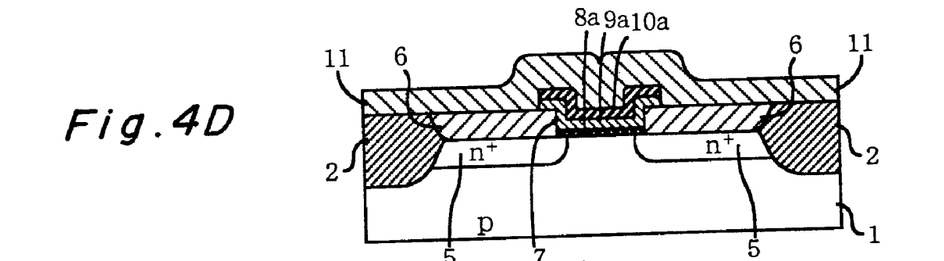
Figure 4E:
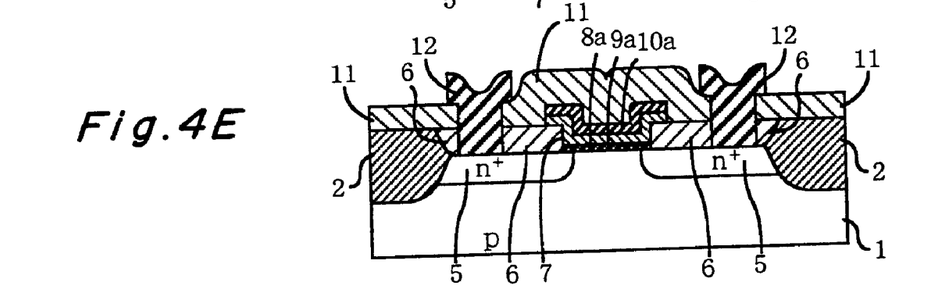

Next, as shown in FIG. 4D, silicon oxide is formed by CVD process as the second interlayer insulator 11 on the overall surface of the p-type semiconductor substrate 1, by which the gate is coated. Finally, as shown in FIG. 4E, a contact hole that extends through the second interlayer insulator 11 and the first interlayer insulator 6 to reach the source/drain region 5 is formed by a known technique, and the contact hole is filled up with an electrically conductive material by sputtering process, by which the source/drain electrode 12 is formed, thus the process being completed.

(Third Embodiment)

FIGS. 5A to 5D and 6A to 6D are fabrication process diagrams of a semiconductor memory device according to a third embodiment of the invention. Component members identical to those of FIGS. 1A to 1E and 2A to 2E are designated by like reference numerals and their description is omitted. This embodiment is a modification of the first embodiment, where an n-type dopant diffusion layer formed on the surface of the p-type semiconductor substrate 1 is separated into the source/drain region 5 by forming a p-type dopant diffusion layer 14 in the channel formation region. As a result of this, it becomes possible to form the gate ferroelectric film 9a in self alignment to the source/drain region 5 without using any dummy gate electrode.

Figure 5A:
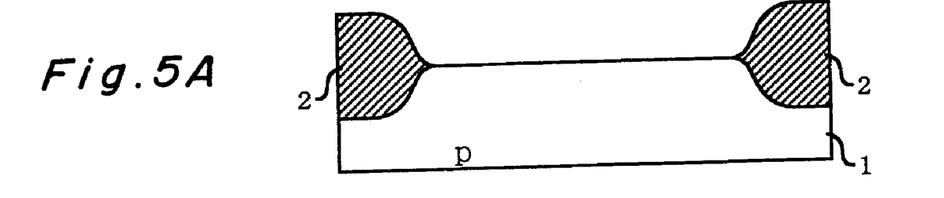
FIGS. 5A, 5B, 5C and 5D are first-half fabrication process diagrams of a semiconductor memory device according to a third embodiment of the invention.
Figure 5B:
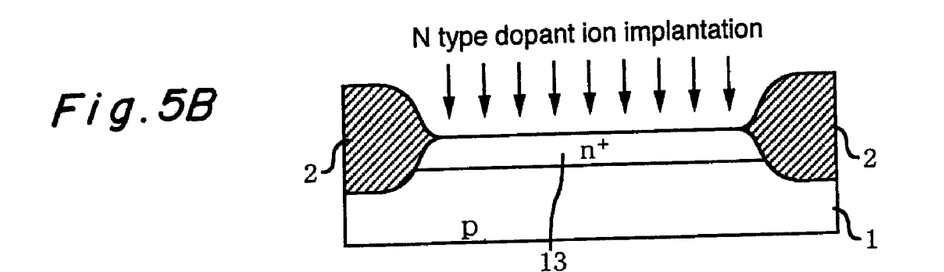

First, as shown in FIG. 5A, silicon oxide is formed by a known technique as the field oxide 2 in a specified region of a p-type silicon substrate used as the p-type semiconductor substrate 1. Next, as shown in FIG. 5B, an n-type dopant arsenic is ion-implanted in the overall surface of the p-type semiconductor substrate 1, and further high-temperature heat treatment is performed to activate the dopant, by which an n-type dopant diffusion region 13 is formed on the surface of the p-type semiconductor substrate 1. In addition, this heat treatment may be omitted, and instead, heat treatment which is later performed for the formation of the source/drain region 5 may substitute for this.

Figure 5C:
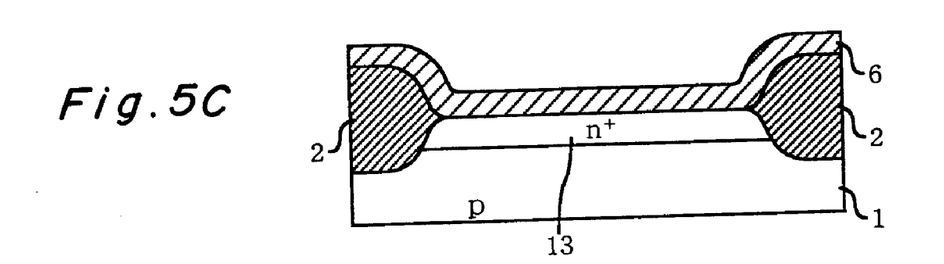

Next, as shown in FIG. 5C, silicon oxide is formed by CVD process as the first interlayer insulator 6 on the overall surface of the p-type semiconductor substrate 1.

Figure 5D:
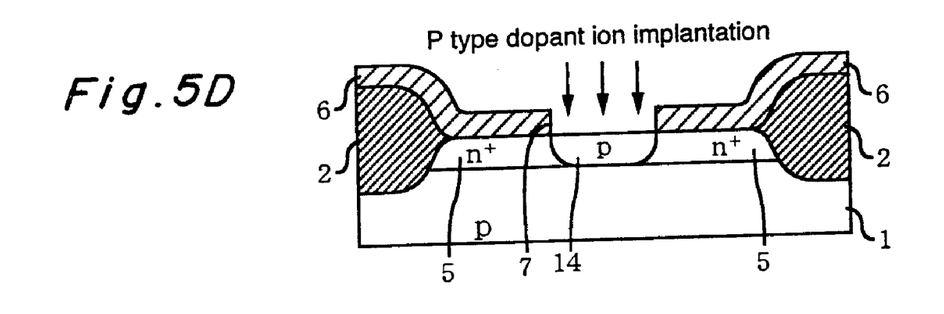

Next, as shown in FIG. 5D, the first interlayer insulator 6 is patterned by using lithography and dry etching, by which the trench 7 that reaches the surface of the p-type semiconductor substrate 1 is formed just above the channel formation region of the p-type semiconductor substrate 1. Subsequently, with the first interlayer insulator 6 used as a dopant implantation mask, a p-type dopant, boron, is ion-implanted in the overall surface of the p-type semiconductor substrate 1, and further high-temperature heat treatment is performed to activate the dopant, by which a p-type dopant diffusion region 14 is formed just under the trench 7. Thus, the n-type source/drain region 5 is formed in self alignment to the trench 7.

Figure 6A:
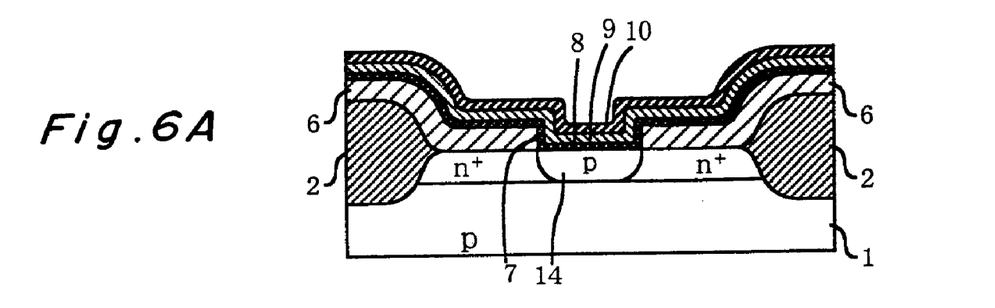
FIGS. 6A, 6B, 6C and 6D are second-half fabrication process diagrams of the semiconductor memory device according to the third embodiment of the invention.

Next, as shown in FIG. 6A, $Bi_2SiO_5$ is formed by CVD process as the buffer dielectric film 8 on the overall surface of the p-type semiconductor substrate 1, subsequently BIT is formed by CVD process as the ferroelectric film 9, and further Pt is formed as the gate electrode material 10 by sputtering.

Figure 6B:
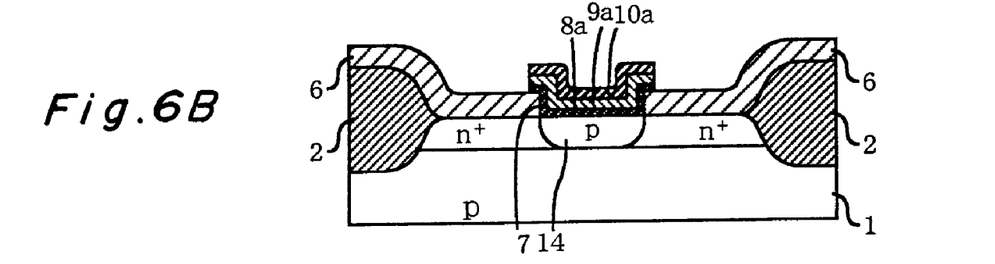

Next, as shown in FIG. 6B, continuous patterning is performed by using lithography and dry etching in order that at least the gate electrode material 10, the ferroelectric film 9 and the buffer dielectric film 8 formed within the trench 7 are left, by which a gate comprising the gate electrode 10a, the gate ferroelectric film 9a and the gate buffer dielectric film 8a is formed in self alignment to the source/drain region 5.

Figure 6C:
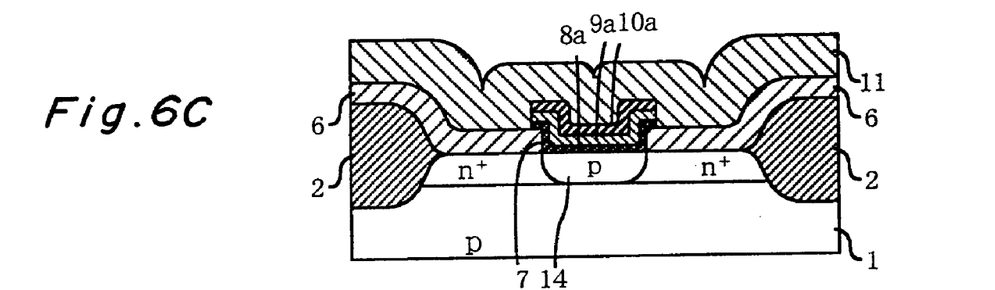
Figure 6D:
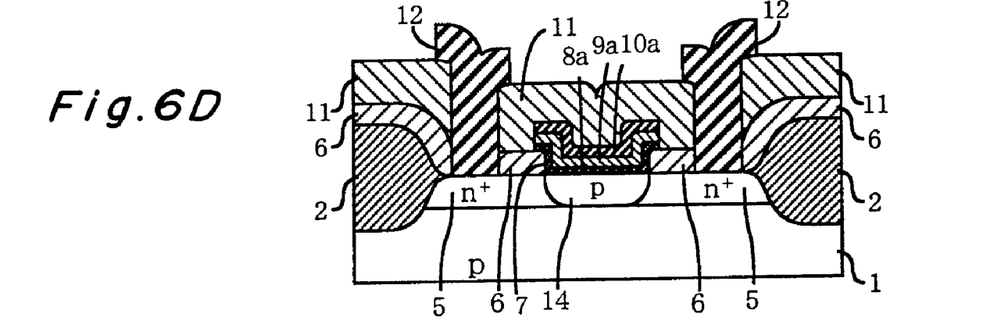

Next, as shown in FIG. 6C, silicon oxide is formed by CVD process as the second interlayer insulator 11 on the overall surface of the p-type semiconductor substrate 1, by which the gate is coated. Finally, as shown in FIG. 6D, a contact hole that extends through the second interlayer insulator 11 and the first interlayer insulator 6 to reach the source/drain region 5 is formed by a known technique, and the contact hole is filled up with an electrically conductive material by sputtering process, by which the source/drain electrode 12 is formed, thus the process being completed.

The invention being thus described, it will be obvious that the same may be varied in many ways. Such variations are not be regarded as a departure from the sprit and scope of the invention, and all such modifications as would be obvious to one skilled in the art are intended to be included within the scope of the following claims.

What is claimed is:

1. A semiconductor memory device comprising:
   a semiconductor substrate of a first conductive type;
   a source/drain region of a second conductive type opposite to the first conductive type formed in the semiconductor substrate;
   an interlayer insulator formed on the semiconductor substrate;
   a trench formed in the interlayer insulator in self alignment to the source/drain region, the trench extending so as to reach a surface of the semiconductor substrate; and
   a gate ferroelectric layer and a gate electrode each formed at least on at least a bottom of the trench so that the ferroelectric layer and the gate electrode are each at least partially in the trench.

2. The semiconductor memory device according to claim 1, wherein the gate has a lamination structure of the gate ferroelectric layer and the gate electrode in this order from the semiconductor substrate side.

3. The semiconductor memory device according to claim 2, wherein a gate buffer dielectric film is provided between the gate ferroelectric layer and the semiconductor substrate.

4. The semiconductor memory device of claim 3, wherein no gate insulator or gate dielectric other than said gate buffer dielectric film is located in said trench.

5. The semiconductor memory device of claim 1, wherein said gate ferroelectric layer contacts a vertically extending side wall of said trench, and wherein said gate ferroelectric layer and said gate electrode are each formed on at least said side wall of said trench and said bottom of said trench.

6. The semiconductor memory device of claim 1, wherein said gate ferroelectric layer and said gate electrode are each formed at least on the bottom and an inner side wall of the trench.

* * * * *